United States Patent
Thompson et al.

[11] Patent Number: 5,986,401
[45] Date of Patent: *Nov. 16, 1999

[54] HIGH CONTRAST TRANSPARENT ORGANIC LIGHT EMITTING DEVICE DISPLAY

[75] Inventors: Mark E. Thompson, Anaheim Hills, Calif.; Stephen R. Forrest; Paul Burrows, both of Princeton, N.J.

[73] Assignees: The Trustee of Princeton University, Princeton, N.J.; The University of Southern California, Los Angeles, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/821,380

[22] Filed: Mar. 20, 1997

[51] Int. Cl.[6] ....................................... H01J 1/62
[52] U.S. Cl. ............................. 313/504; 313/506
[58] Field of Search ................... 313/504, 506, 313/466

[56] References Cited

U.S. PATENT DOCUMENTS

| | | | |
|---|---|---|---|
| 4,758,765 | 7/1988 | Mitsumori | 313/506 |
| 5,045,750 | 9/1991 | Itou et al. | 313/466 |
| 5,104,749 | 4/1992 | Sato et al. | 482/690 |
| 5,445,899 | 8/1995 | Budzilek et al. | 428/690 |
| 5,534,748 | 7/1996 | Oomen | 313/479 |
| 5,674,635 | 10/1997 | Hsieh et al. | 428/690 |
| 5,703,436 | 12/1997 | Forrest et al. | |
| 5,707,745 | 1/1998 | Forrest et al. | |

*Primary Examiner*—Vip Patel
*Assistant Examiner*—Matthew J. Gerike
*Attorney, Agent, or Firm*—Kenyon & Kenyon

[57] ABSTRACT

A high contrast organic light emitting device (OLED) display utilizing a transparent (TOLED) display structure with a low-reflectance absorber arranged behind the display. The TOLED display allows substantially all light incident on the display to pass through the display and to be absorbed by the low-reflectance absorber With the amount of light reflected by the display thus substantially reduced, the contrast of images displayed by the display is thus improved.

13 Claims, 3 Drawing Sheets

shows a vehicle, television or computer, screen, sign, telecommunications device or telephone incorporating a light emitting device.

HIGH CONTRAST TRANSPARENT ORGANIC LIGHT EMITTING DEVICE DISPLAY

GOVERNMENT RIGHTS

This invention was made with Government support under contract No. F336175-94-1-14147 awarded by DARPA. The Government has certain rights in the subject invention.

FIELD OF THE INVENTION

The present invention relates to the field of light emitting devices, in particular, to high contrast displays comprising transparent organic light emitting devices (TOLEDs).

BACKGROUND INFORMATION

Conventional displays, including LCD (liquid crystal) and conventional OLED (organic light emitting device) displays, are not well suited for viewing under bright ambient light. As illustrated in FIG. 1, light R emitted from a bright light source L, such as the sun, is reflected from one or more layers (primarily the metallic layers) of a conventional display D. The reflected light R interferes with the ability of a viewer V to view information bearing light I generated by the display D, thereby reducing the perceived contrast of the image generated by the display D.

The need therefore exists for an OLED display with improved contrast which can be viewed under bright ambient light conditions.

SUMMARY OF THE INVENTION

The present invention is directed to a high contrast, transparent organic light emitting device (TOLED) display. The contrast of the display of the present invention is improved by minimizing the amount of light reflected from the display. This is accomplished by the use of a display with a TOLED structure and by the arrangement of a low-reflectance absorber behind the TOLED display. TOLEDs have substantially transparent conducting layers and as such do not reflect light as do the metallic conducting layers of conventional OLEDs. The low-reflectance absorber arranged behind the TOLED display acts to absorb the light which passes through the TOLED display. The majority of the light incident on the TOLED display is absorbed by the low-reflectance absorber, with very little of the incident light reflected back to the viewer. This configuration provides improved contrast of the image displayed by the display. The display of the present invention also exhibits improved contrast for images of different colors.

The high contrast TOLED display of the present invention can be used in a wide variety of applications, including computer displays, informational displays in vehicles, television monitors, telephones, printers, illuminated signs, large-area screens and billboards.

DETAILED DESCRIPTION

Figure 1:
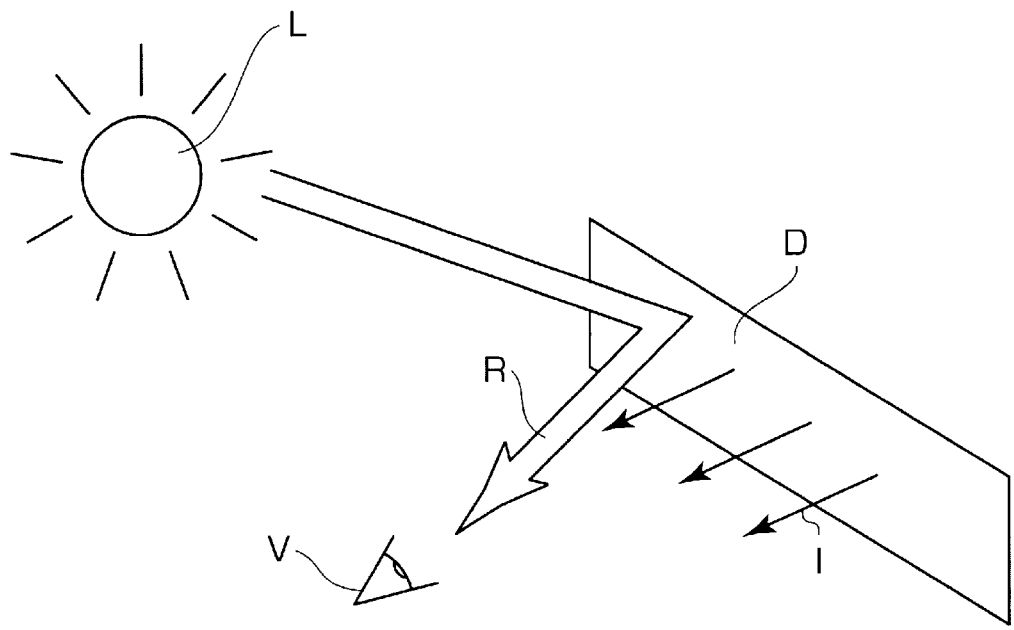
FIG. 1 shows a conventional display device under bright ambient light conditions.
Figure 2:
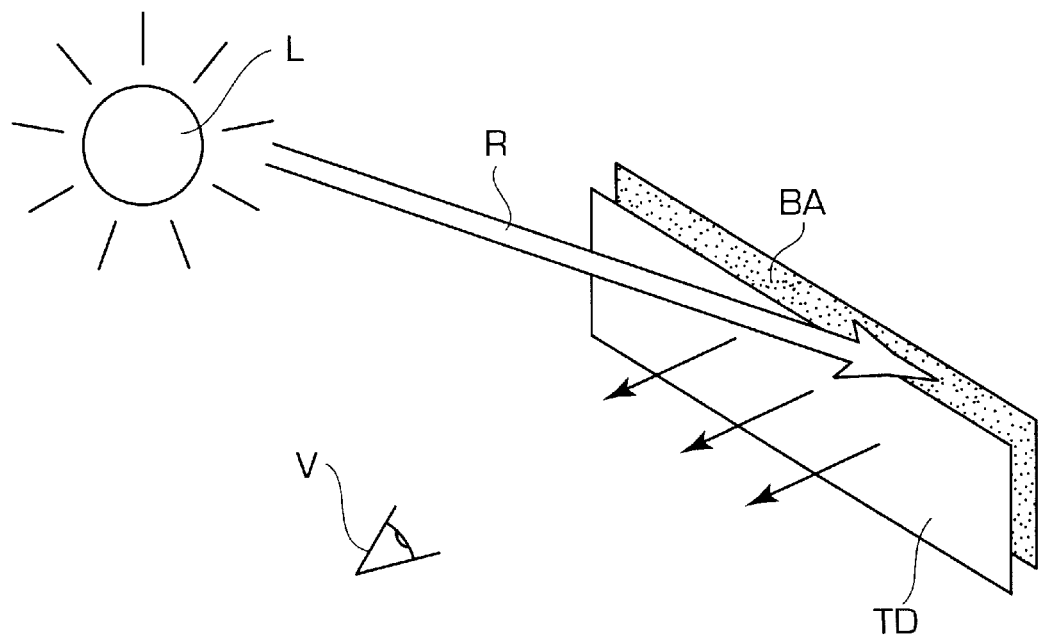
FIG. 2 shows a high contrast TOLED display, in accordance with the present invention, under bright ambient light conditions.

FIG. 2 shows a high contrast TOLED display, in accordance with the present invention, under bright ambient light conditions, such as in sunlight. The high contrast TOLED display of the present invention comprises a TOLED display TD and a low-reflectance absorber, such as a black absorber BA arranged behind the display TD. The TOLED display TD can be fabricated as disclosed in U.S. patent applications Ser. Nos. 08/354,674 which issued as U.S. Pat. No. 5,707,745 and 08/613,207 which issued as U.S. Pat. No. 5,703,436, incorporated herein by reference in their entirety.

As illustrated in FIG. 2, light R emitted from a bright light source L, such as the sun, passes through the various layers of the TOLED display TD and is absorbed by the black absorber BA. As a result, light I emitted by the display TD and viewed by a viewer V is not washed out by ambient light which is reflected by the display, as is the case with conventional displays.

Figure 3:
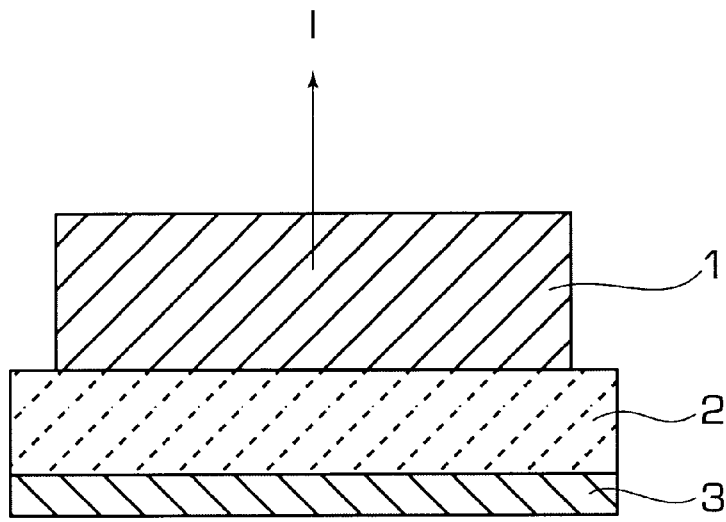
FIG. 3 is a cross-sectional view of a first embodiment of a high contrast TOLED display, in accordance with the present invention.

A cross-sectional view of an embodiment of a high contrast display in accordance with the present invention is shown in FIG. 3. A TOLED 1 is arranged over a transparent substrate 2 which is arranged over a low-reflectance absorber 3. Light I emitted from the TOLED 1 propagates toward the viewer. The TOLED 1, which is comprised of several different layers of materials is shown, for simplicity, as one layer. The transparent substrate 2 can be comprised of glass or of plastic, which may be flexible or rigid.

The low-reflectance absorber 3 can be comprised, for example, of a layer of paper or cardboard painted or printed black at least on the side facing the substrate 2. The low-reflectance absorber 3 can also be deposited directly onto the bottom side of the substrate 2, such as by painting the bottom of the substrate with a black, preferably matte, paint. The low-reflectance absorber 3 can also be implemented by spin coating carbon black onto a polymer matrix or by evaporation deposition.

Figure 4:
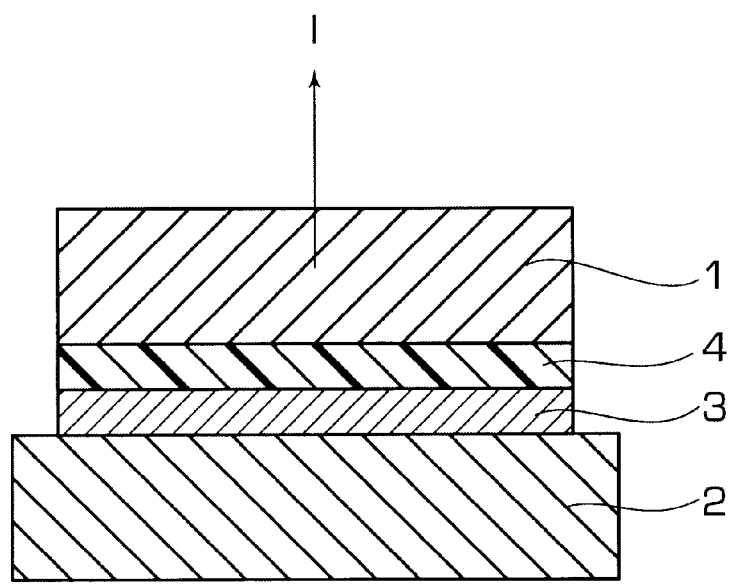
FIG. 4 is a cross-sectional view of a second embodiment of a high contrast TOLED display, in accordance with the present invention.

A cross-sectional view of a second embodiment of a high contrast display in accordance with the present invention is shown in FIG. 4. In this embodiment, a low-reflectance absorber 3 is arranged between a TOLED 1 and a substrate 2. In the embodiment of FIG. 4, the low-reflectance absorber 3 is deposited onto the substrate 2. The substrate 2 need not be transparent. The low-reflectance absorber 3 and the substrate 2 can also be implemented as one layer.

Because it is desirable to make the surface of the low-reflectance absorber 3 facing the viewer as absorptive as possible, this surface may be relatively rough and thus may be undesirable for the fabrication thereon of the TOLED 1. As such, if need be, a planarizing layer 4 can be deposited on the reflectance absorber 3 to provide a smooth surface on which to deposit the TOLED 1. The planarizing layer 4 can be comprised, for instance, of a polymer or plastic and can be applied by spin coating.

While the low-reflectance absorber can be implemented, as described above, as a "black absorber," the present invention may also embrace the use of a low-reflectance absorber having a color different from that of the color emitted by the TOLED. For example, a dark green absorber behind a red-emitting TOLED, or still other combinations of selected colors, may also be used within the scope of the subject invention so as to provide a high color contrast display. The low-reflectance surface, thus, may have a high light absorption across the entire visible region of the spectrum so as to produce a gray-to-black surface or it may have high absorption only over that part of the spectral region corresponding to the wavelength region generated by the light emitting device. Preferably, the absorption of light is at least about 50%, and more preferably, about 80–90% or still higher, for a black absorber.

Figure 5:
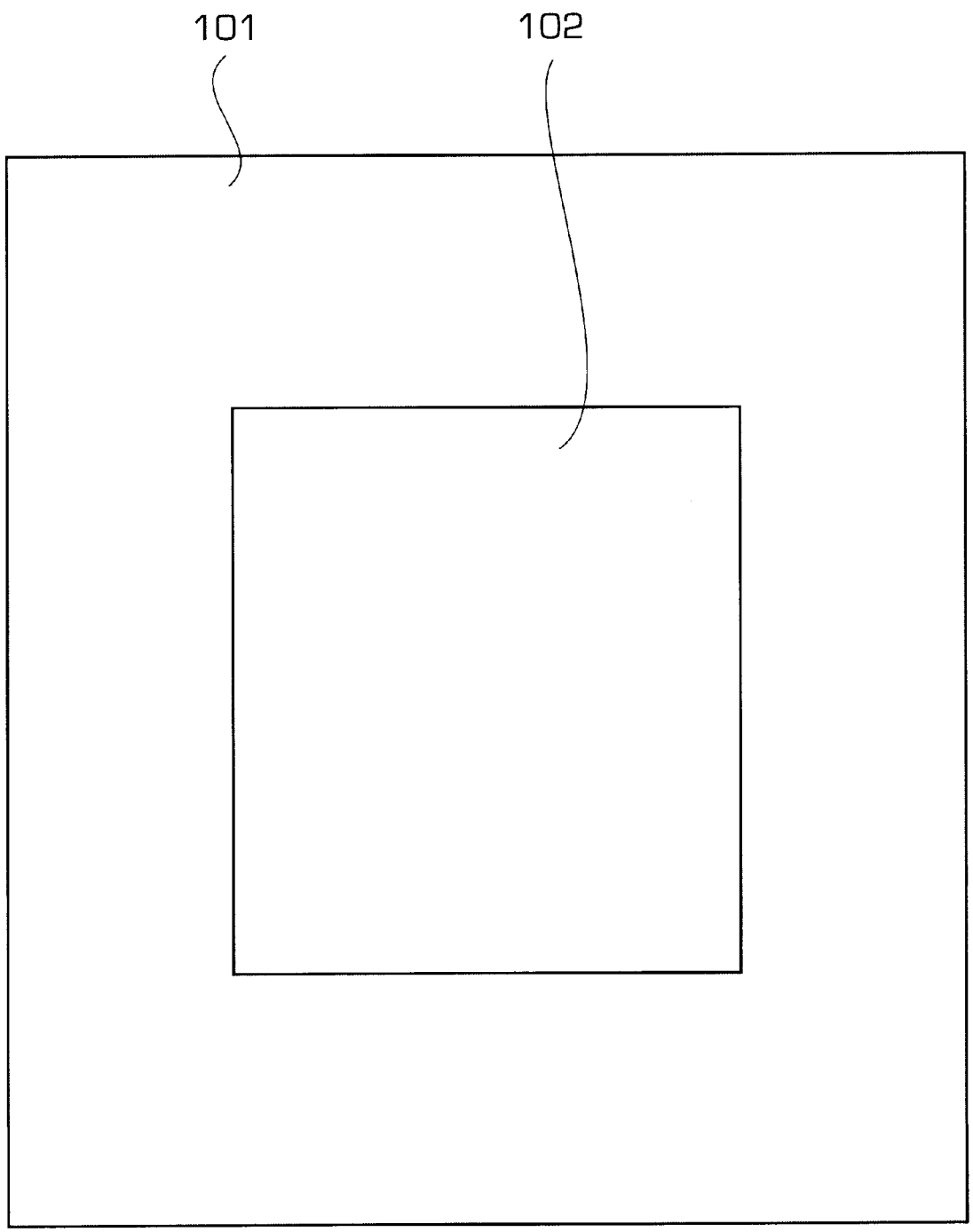
FIG. 5 shows a vehicle, television or computer, screen, sign, telecommunications device or telephone incorporating a light emitting device.

FIG. 5 shows a vehicle, television, computer, screen, sign, telecommunications device or telephone (represented as 101) incorporating a light emitting device (represented as 102).

The subject invention as disclosed herein may be used in conjunction with the subject matter of co-pending applications, "Novel Materials for Multicolor LED's," U.S. Ser. No. 08/771,815; "Electron Transporting and Light Emitting Layers Based on Organic Free Radicals," U.S. Ser. No. 08/774,120; "Multicolor Display Devices," U.S. Ser. No. 08/772,333; and "Red-Emitting Organic Light Emitting Devices (LED's)," U.S. Ser. No. 08/774,087, each of said co-pending applications being filed on Dec. 23, 1996, and being herein incorporated in its entirety by reference. The subject invention as disclosed herein may also be used in conjunction with the subject matter of co-pending application, "Vacuum Deposited, Non-Polymeric Flexible Organic Light Emitting Devices," U.S. Ser. No. 08/789,319, filed on Jan. 23, 1997, and being herein incorporated in its entirety by reference. The subject invention as disclosed herein may also be used in conjunction with the subject matter of co-pending applications, "Driving Circuit for Stacked Organic Light Emitting Devices," U.S. Ser. No. 08/792,050, which issued as U.S. Pat. No. 5,757,139; "Displays Having Mesa Pixel Configuration," U.S. Ser. No. 08/794,595; and "Stacked Organic Light Emitting Devices," U.S. Ser. No. 08/792,046, each of said co-pending applications being filed on Feb. 3, 1997, and being herein incorporated in its entirety by reference. The subject invention may also be used in conjunction with the subject matter of each of co-pending U.S. patent applications Ser. Nos. 08/354,674, which issued as U.S. Pat. No. 5,707,745, 08/613,207, 08/632,316, which issued as U.S. Pat. No. 5,721,160, 08/632,322 which issued as U.S. Pat. No. 5,757,026 and 08/693,359 and U.S. Provisional patent applications Ser. Nos. 60/010,013 and 60/024,001, each of which is also herein incorporated in their entirety by reference.

What is claimed is:

1. A high contrast light emitting display comprising:

a substantially transparent organic light emitting device; and a low-reflectance absorber arranged proximate to the substantially transparent organic light emitting device, wherein a substantially transparent substrate is arranged between the substantially transparent organic light emitting device and the low-reflectance absorber.

2. The display of claim 1, wherein the low-reflectance absorber is a black absorber.

3. The display of claim 1, wherein the low-reflectance absorber is deposited on the substantially transparent substrate.

4. A vehicle incorporating a display in accordance with claim 1.

5. A television incorporating a display in accordance with claim 1.

6. A computer incorporating a display in accordance with claim 1.

7. A screen incorporating a display in accordance with claim 1.

8. A sign incorporating a display in accordance with claim 1.

9. A telecommunications device incorporating a display in accordance with claim 1.

10. A telephone incorporating a display in accordance with claim 1.

11. A high contrast light emitting display comprising:

a substantially transparent organic light emitting device; and a low-reflectance absorber arranged proximate to the substantially transparent organic light emitting device, wherein the low-reflectance absorber is arranged between the substantially transparent organic light emitting device and a substrate.

12. The display of claim 11, wherein the low-reflectance absorber is a black absorber.

13. The display of claim 11, wherein the low-reflectance absorber is deposited on the substantially transparent substrate.

* * * * *